(12) United States Patent
Li et al.

(10) Patent No.: US 12,684,690 B2
(45) Date of Patent: Jul. 14, 2026

(54) ELECTRONIC DEVICE

(71) Applicant: PanelSemi Corporation, New Taipei City (TW)

(72) Inventors: Chin-Tang Li, New Taipei City (TW); Chao-Jung Chen, New Taipei City (TW)

(73) Assignee: PANELSEMI CORPORATION, New Taipei City (TW)

( * ) Notice: Subject to any disclaimer, the term of this patent is extended or adjusted under 35 U.S.C. 154(b) by 207 days.

(21) Appl. No.: 18/463,420

(22) Filed: Sep. 8, 2023

(65) Prior Publication Data

US 2024/0090129 A1     Mar. 14, 2024

(30) Foreign Application Priority Data

Sep. 8, 2022    (TW) .................................. 111134193
Sep. 7, 2023    (TW) .................................. 112134146

(51) Int. Cl.
H05K 1/11          (2006.01)

(52) U.S. Cl.
CPC .... H05K 1/111 (2013.01); H05K 2201/09236 (2013.01); H05K 2201/09509 (2013.01)

(58) Field of Classification Search
CPC ......... H05K 1/111; H05K 2201/09236; H05K 2201/09509; H05K 1/144
See application file for complete search history.

(56) References Cited

U.S. PATENT DOCUMENTS

2017/0094798 A1*    3/2017    Yosui ................... H05K 1/0313
2020/0091104 A1*    3/2020    Takada ................. H05K 3/4647

* cited by examiner

*Primary Examiner* — Timothy J Thompson
(74) *Attorney, Agent, or Firm* — MUNCY, GEISSLER, OLDS & LOWE, P.C.

(57)          ABSTRACT

An electronic device includes a first substrate and a second substrate stacked on each other, a plurality of pad groups, a plurality of channels, and a plurality of conductive members. The first substrate and the second substrate respectively have an inner surface facing to each other and an outer surface away from each other. Each pad group includes two conductive pads, which are respectively disposed at the outer surfaces of the first substrate and the second substrate and are located corresponding to each other. The channels pass through the first substrate and the second substrate, and each channel is disposed corresponding to one of the pad groups. Two ends of each channel are respectively sealed by the two conductive pads of the corresponding pad group. The conductive members are disposed in the channels, and each conductive member is electrically connected to the two conductive pads of the corresponding pad group.

9 Claims, 4 Drawing Sheets

ELECTRONIC DEVICE

CROSS REFERENCE TO RELATED APPLICATIONS

This Non-provisional application claims priority under 35 U.S.C. § 119(a) on Patent Application No(s). 111134193 filed in Taiwan, Republic of China on Sep. 8, 2022, and 112134146 filed in Taiwan, Republic of China on Sep. 7, 2023, the entire contents of which are hereby incorporated by reference.

BACKGROUND

Technology Field

This disclosure relates to an electronic device and, in particular, to an electronic device that can achieve signal transmission by blind holes.

Description of Related Art

In the manufacturing process of electronic devices, in order to electrically connect the circuits on the upper and lower surfaces of the electronic device, one kind of conventional solutions is to drill holes through the substrate first, and then to plate a conductive film in the holes with an electroplating process. The plated conductive film in the holes can be electrically connected to the circuits on the upper and lower surfaces. Another solution is to use side jumpers aside from the electronic device to electrically connect the circuits on the upper and lower surfaces from the side of the electronic device, so as to achieve the signal transmission.

SUMMARY

One or more exemplary embodiments of this disclosure are to provide an electronic device providing a signal transmission between the outermost layers of both or more substrates by blind holes with conductive members.

An electronic device of one exemplary embodiment includes a first substrate, a second substrate, a plurality of pad groups, a plurality of channels, and a plurality of conductive members. The first substrate and the second substrate are stacked on each other. Each of the first substrate and the second substrate has an inner surface and an outer surface, the inner surfaces of the first substrate and the second substrate face to each other, and the outer surfaces of the first substrate and the second substrate are away from each other. Each of the pad groups includes two conductive pads, and the two conductive pads of each pad group are respectively disposed at the outer surfaces of the first substrate and the second substrate and are corresponded to each other. The channels communicate with the first substrate and the second substrate. Each of the channels correspond to one of the pad groups, and two ends of each channel are respectively sealed by two conductive pads of the corresponding pad group. The conductive members are disposed in the channels respectively, and each conductive member is electrically connected to two conductive pads of the corresponding pad group.

In one exemplary embodiment, the electronic device further includes a bonding layer arranged between the first substrate and the second substrate.

In one exemplary embodiment, the quantity of the first substrate is plural, and the first substrates are laid and tiled along the inner surface of the second substrate.

In one exemplary embodiment, the quantity of the second substrate is plural, and the first substrates are laid and tiled along the inner surface of the second substrates.

In one exemplary embodiment, one of the first substrate and one of the second substrate are partially overlapped in a direction perpendicular to the outer surface of either one of the substrates.

In one exemplary embodiment, each of the channels is wider at a middle part than two ends thereof.

In one exemplary embodiment, the first substrate defines a plurality of first through holes, the second substrate defines a plurality of second through holes, the first through holes corresponds to the second through holes respectively, and each of the first through holes and a corresponding one of the second through holes are together to form at lease a part of one of the corresponding channels.

In one exemplary embodiment, with respect to each of the first through holes, one end, approaching the inner surface of the first substrate, is wider than the other end, approaching the outer surface of the first substrate. With respect to each of the second through holes, one end, approaching the inner surface of the second substrate, is wider than the other end, approaching the outer surface of the second substrate.

In one exemplary embodiment, each of the conductive members is made of one single material.

In one exemplary embodiment, the outer surface of the first substrate includes a trace layer provided with a thickness, the trace layer electrically connects to at least one of the conductive pads of the pad groups arranged at the outer surface of the first substrate, and the thickness of the trace layer is no greater than ¼ mil.

In one exemplary embodiment, the outer surface of the second substrate includes a trace layer provided with a thickness, the trace layer electrically connects to at least one of the conductive pads of the pad groups arranged at the outer surface of the second substrate.

In one exemplary embodiment, the thickness of the trace layer arranged at the outer surface of the second substrate is no greater than ¼ mil.

In one exemplary embodiment, one or both of the inner surfaces of the first substrate and the second substrate is/are arranged with a trace layer, and the trace layer is electrically connected to one or more of the conductive members.

In one exemplary embodiment, one or both of the inner surfaces of the first substrate and the second substrate is/are arranged with a trace layer, and the trace layer is insulated to the conductive members (i.e., the trace layer is not electrically connected to the conductive members as is without additional connection).

In one exemplary embodiment, the electronic device further includes a plurality of electronic components, at least part of the electronic components are arranged at the outer surface of the first substrate and electrically connect to ones of the conductive pads of the pad groups arranged at the outer surface of the first substrate respectively.

In one exemplary embodiment, at least part of the electronic components are arranged at the outer surface of the second substrate and electrically connect to ones of the conductive pads of the pad groups arranged at the outer surface of the second substrate respectively.

In one exemplary embodiment, one or more additional substrates are applied between the first and second substrates, and the channels passes through the additional substrate(s).

In one exemplary embodiment, ones of the additional substrates are laid and tiled along either one of the inner surfaces of the first and second substrates.

In one exemplary embodiment, ones of the additional substrates are stacked in the direction perpendicular to either one of the outer surfaces of the first and second substrates.

In one exemplary embodiment, ones of the additional substrates are provided with a trace layer on either or both opposite surfaces thereof.

As mentioned above, in the electronic device of this disclosure, two conductive pads of each pad group are respectively disposed at the outer surfaces of the first substrate and the second substrate and are corresponded to each other. The channels communicate with the first substrate and the second substrate, each channel is disposed corresponding to one of the pad groups. Two ends of each channel are respectively sealed by two conductive pads of the corresponding pad group. The conductive members are disposed in the channels respectively, and each conductive member is electrically connected to the conductive pads of the corresponding pad group. According to the configuration and design of this disclosure, the electrical signals can be transmitted between the conductive pads formed at the outermost layers by the conductive members arranged in the channels inside the electronic device. As a result, the traces arranged at the outermost layers of the electronic device can be electrically connected to each other by the inside blind holes (channels) with conductive members, thereby achieving signal transmission between the traces formed at the outermost layers of the electronic device.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements. The drawings of the following embodiments only illustrate the relative relationship between elements or units, and do not represent the actual size or proportion of the elements or units.

Figure 1:
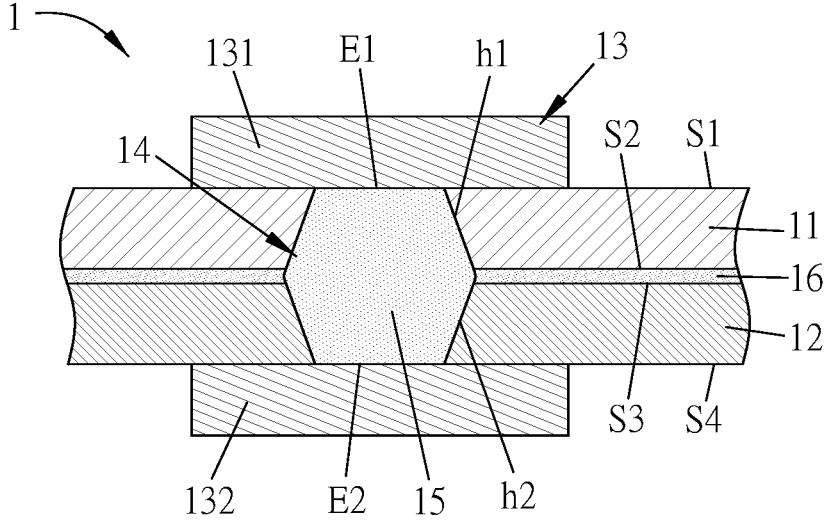
FIG. 1 is a schematic diagram showing a part of an electronic device according to an embodiment of this disclosure.

FIG. 1 is a schematic diagram showing a part of an electronic device according to an embodiment of this disclosure, and FIGS. 2 to 5 are schematic diagrams showing a part of an electronic device according to different embodiments of this disclosure.

Referring to FIG. 1, an electronic device 1 includes a first substrate 11, a second substrate 12, a plurality of pad groups 13, a plurality of channels 14, and a plurality of conductive members 15. To be noted, for the concise description, FIG. 1 only shows one pad group 13, one channel 14, and one conductive member 15. In addition, the electronic device 1 of this embodiment can further include a bonding layer 16.

The first substrate 11 and the second substrate 12 are stacked on each other. The first substrate 11 has an outer surface S1 and an inner surface S2, and the second substrate 12 has an inner surface S3 and an outer surface S4. The inner surface S2 of the first substrate 11 and the inner surface S3 of the second substrate 12 face to each other, and the outer surface S1 of the first substrate 11 and the outer surface S4 of the second substrate 12 are away from each other. The outer surface S1 and the inner surface S2 are two opposite surfaces of the first substrate 11, and the inner surface S3 and the outer surface S4 are two opposite surfaces of the second substrate 12. In this embodiment, the inner surfaces S2 and S3 are located at the inside of the electronic device 1, and the outer surfaces S1 and S4 are the external surfaces of the electronic device 1 (i.e., the outermost surfaces of the electronic device 1). The first substrate 11 and the second substrate 12 can be resilient boards, rigid boards or composite boards, and the materials thereof can include, for example, glass, glass fiber epoxy resin (e.g. FR4), low temperature co-fired ceramics (LTCC), polyimide (PI), polytetrafluoroethylene (PTFE), polyphenylene oxide (PPO) or polyphenylene ether (PPE), or a substrate composed of composite materials including at least one of the aforementioned materials. In this embodiment, the first substrate 11 is a resilient board, such as a PI substrate, and the second substrate 12 is a rigid board, such as a single-layer glass substrate.

Figure 3A:
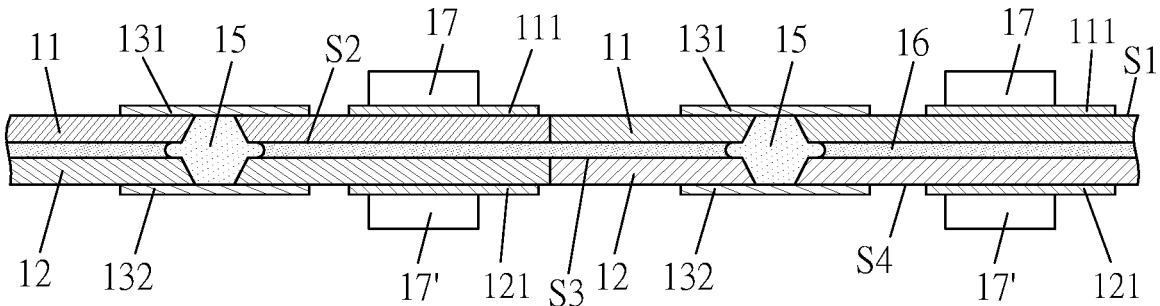
Figure 3B:
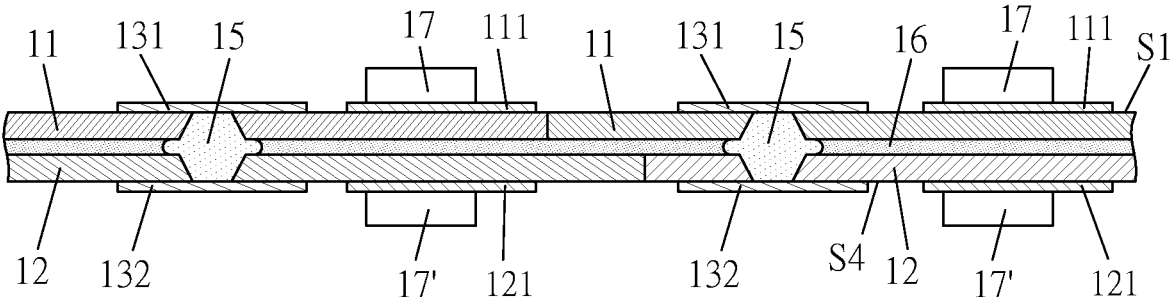

The bonding layer 16 is arranged between the inner surface S2 of the first substrate 11 and the inner surface S3 of the second substrate 12, so that the first substrate 11 and the second substrate 12 can be connected to each other by the bonding layer 16. The bonding layer 16 can be laid continuously (e.g. laid continuously along a plane) or discontinuously (e.g. laid intermittently along a plane, or laid along the areas without interfering the functions of other components). The bonding layer 16 can be an insulating adhesive, and the material thereof can be, for example but not limited to, optical clear adhesive (OCA), optical clear resin (OCR), polyimide (PI), or the likes. It should be noted that the electronic device 1 of this embodiment includes one first substrate 11, but the electronic device of another embodiment can include two or more first substrates 11. In another embodiment, the two or more first substrates 11 can be laid along the third surface S3 of the second substrate 12 (i.e., the first substrates 11 are laid along the plane of the third surface S3 of the second substrate 12), and the first substrates 11 are connected to the second substrate 12 by the bonding layer 16. In different embodiments, as shown in FIG. 3A, the electronic device can include two or more second substrates 12, so that the two or more first substrates 11 are laid alone a virtual surface tiled by the third surfaces S3 of two or more second substrates 12, and each first substrate 11 is connected to one or more corresponding second substrate(s) 12. In addition, as shown in FIG. 3B, the second substrates 12 and the first substrates 11 can be partially overlapped in the direction perpendicular to any of the outer surfaces (S1 and S4) of each substrate (the first substrate 11 or the second substrate 12). That is, the second substrate(s) 12 and the first substrate(s) 11 are arranged in a stagger manner in the direction perpendicular to any of the outer surfaces S1 and S4, thereby improving the structural strength or\and achieving electrical connection.

With reference to FIG. 1 again, each of the pad groups 13 includes two conductive pads 131 and 132, and the two conductive pads 131 and 132 of each pad group 13 are respectively disposed at the outer surface S1 of the first substrate 11 and the outer surface S4 of the second substrate 12 and are located corresponding to each other. Specifically, the conductive pad 131 of each pad group 13 is disposed at the outer surface S1 of the first substrate 11, and the conductive pad 132 of each pad group 13 is disposed at the outer surface S4 of the second substrate 12. The conductive pads 131 and 132 of each pad group 13 are arranged corresponding to each other in the direction perpendicular to the outer surface S1 (or the outer surface S4). The material of the conductive pads 131 and 132 can be, for example but not limited to, gold, copper, aluminum, or any combinations thereof, or an alloy including any combinations of the aforementioned materials, or any of other conductive metal materials, or any of other conductive non-metal materials.

Each of the channels 14 communicates with the first substrate 11 and the second substrate 12, and each channel 14 is disposed to correspond to one of the pad groups 13. In this embodiment, the channels 14 and the pad groups 13 are arranged in a one-to-one manner. Each channel 14 defines two opposite ends E1 and E2, which are sealed by the conductive pads 131 and 132 of the corresponding pad group 13 respectively. In other words, one end E1 of each channel 14 is covered and sealed by the corresponding conductive pad 131, and the other end E2 of the channel 14 is covered and sealed by the corresponding conductive pad 132. Specifically, the first substrate 11 includes a plurality of first through holes h1, and the second substrate 12 includes a plurality of second through holes h2. The first through holes h1 are arranged corresponding to the second through holes h2 respectively, and one first through hole h1 and the corresponding second through hole h2 are together to form at least part of the corresponding channel 14. In this case, one first through hole h1 and the corresponding second through hole h2 can form one complete channel 14. In addition, with respect to each first through hole h1, one end of the first through hole h1 located at the inner surface S2 of the first substrate 11 is wider than the other end of the first through hole h1 located at the outer surface S1 of the first substrate 11; and with respect to each second through hole h2, one end of the second through hole h2 located at the inner surface S3 of the second substrate 12 is wider than the other end of the second through hole h2 located at the outer surface S4 of the second substrate 12. Accordingly, each channel 14 can have a structure with a wider middle part and two narrower end parts; in another words, each channel 14 tapers outwardly from the middle part to two ends. To be noted, this disclosure is not limited thereto. In another embodiments, each channel 14 can have a structure with a narrower middle part and two wider end parts, or each channel 14 can have a structure with a uniform width (the middle part and end parts have the same width). In this embodiment, each channel 14 (or each conductive member 15) further passes through the bonding layer 16. In some embodiments to implement the structure of each channel 14, one or more laser beams can be provided toward the first substrate 11 in the direction from the inner surface S2 to the outer surface S1 of the first substrate 11, thereby forming a plurality of first through holes h1 in the first substrate 11 while one end of each first through hole h1 located at the inner surface S2 is wider than the other end of the first through hole h1 located at the outer surface S1. Moreover, in another embodiment to implement the structure of each channel 14, one or more laser beams can be provided toward the second substrate 12 in the direction from the inner surface S3 to the outer surface S4 of the second substrate 12, thereby forming a plurality of second through holes h2 in the second substrate 12 and corresponding to the first through holes h1, respectively, while one end of each second through hole h2 located at the inner surface S3 is wider than the other end of the second through hole h2 located at the outer surface S4. To be noted, the "width" of the through holes is defined in the direction parallel to the inner surface S2 of the first substrate 11 or the inner surface S3 of the second substrate 12.

Figure 4A:
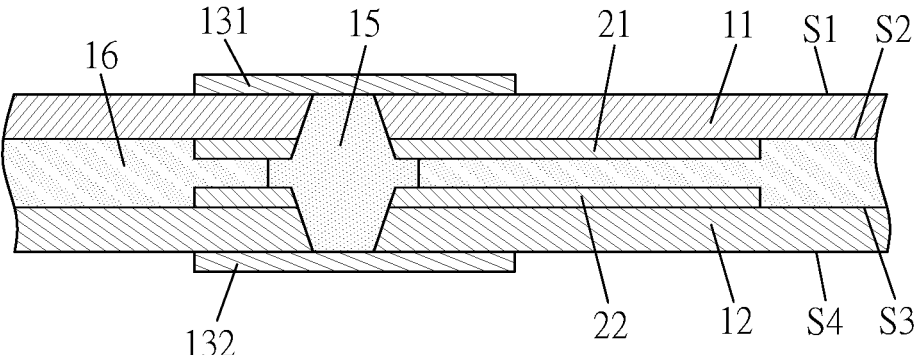
Figure 4B:
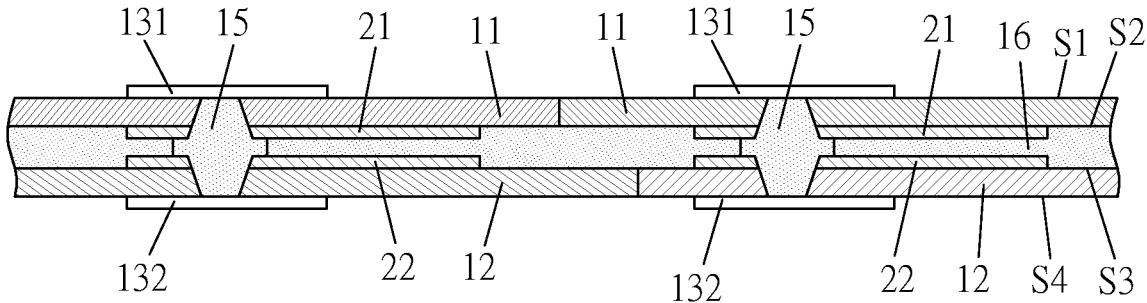

The plurality of conductive members 15 are arranged in the channels 14, and each conductive member 15 is electrically connected to the conductive pads 131 and 132 of the corresponding pad group 13. Specifically, each channel 14 can be filled with a conductive member 15, so that the conductive member 15 is in contact with the connection pad 131 located at/by the end E1 of the channel 14 and is in contact with the corresponding conductive pad 132 located at/by the other end E2 of the channel 14. Accordingly, the electrical signals can be transmitted between the conductive pads 131 and 132 by the conductive member 15 arranged in the channel 14 (blind hole) inside the electronic device 1. In other words, the electrical signals can be transmitted from the conductive pad 131 arranged at the outer surface S1 of the first substrate 11 (the outermost layer of the electronic device 1) to the conductive pad 132 arranged at the outer surface S4 of the second substrate 12 (the outermost layer of the second substrate 12) by the conductive member 15; and vice versa. In some embodiments, each of the conductive members 15 is made of a single material. In practice, for example, the silver adhesive, copper adhesive, solder, or any of other conductive materials can be placed in the through hole h1 and the through hole h2 simultaneously or separately to form the conductive materials in the through holes h1 and h2. Additional conductive materials (the same or different materials) can be further added to the aforementioned conductive materials, thereby forming the conductive member 15. For example, the conductive materials can be filled in the first through hole h1 and the second through hole h2 at simultaneously or separately. Then, the inner surface S2 of the first substrate 11 and the inner surface S3 of the second substrate 12 are attached to each other. In addition, before attaching the first substrate 11 and the second substrate 12, the predetermined connection positions can be provided with the same or different conductive materials, and then the processes, such as reflowing, baking or curing, are performed. Herein, the additionally provided conductive materials can include metal dots (e.g. tin, copper, silver, etc.), or conductive particles. The conductive particles can distribute in an insulating adhesive (film/material) to form an anisotropic conductive adhesive (film/material). In some embodiments, the conductive materials filled in the first through hole h1 and the second through hole h2 can be different conductive materials, and this disclosure is not limited. In different embodiments, referring to FIGS. 4A and 4B, at least one of the inner surface S2 of the first substrate 11 and the inner surface S3 of the second substrate 12 can be further provided with a trace layer 21 and a trace layer 22. As shown in FIG. 4A, the trace layer 21 or/and the trace layer 22 can be electrically connected to one or more conductive members 15. As shown in FIG. 4B, the electronic device 1 can include a plurality of first substrates 11 or/and a plurality of second substrates 12, one or both of the trace layer 21 and the trace layer 22 can be electrically connected to one or more of the conductive members 15. In some embodiments, one or both of the trace layer 21 and the trace layer 22 are not necessarily electrically connected to the conductive members 15, and this disclosure is not limited thereto. In addition, the trace layer 21 or/and the trace layer 22 may further comprise some circuits.

Figure 4C:
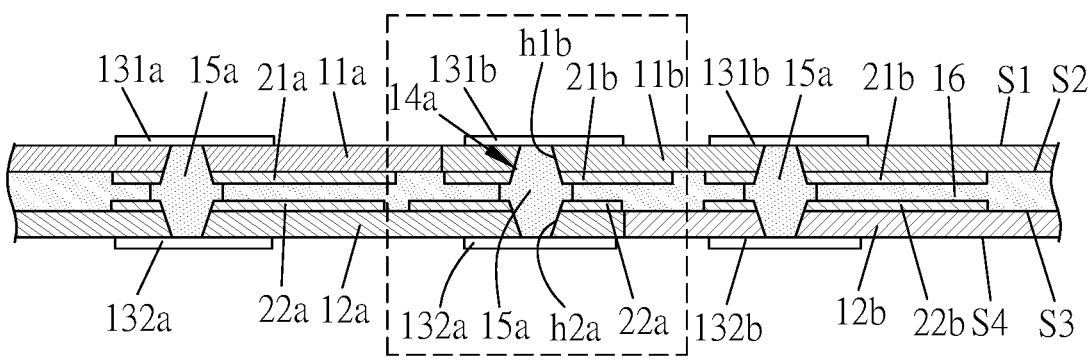

Referring to FIG. 4C, the electronic device of this embodiment includes at least two adjacently arranged first substrates 11*a* and 11*b* and at least two adjacently arranged second substrates 12*a* and 12*b*. The first substrate 11*a* and 11*b* are tilted and laid along a virtual plane, which is formed by tilting the inner surfaces S3 of the second substrates 12*a* and 12*b*. The first substrates 11*a* and 11*b* and the second substrates 12*a* and 12*b* are at least partially overlapped in a direction perpendicular to the outer surface (S1 or S4) of the substrate, and the first substrates 11*a* and 11*b* and the second substrates 12*a* and 12*b* are arranged in a stagger manner. The first substrates 11*a* and 11*b* and the second substrates 12*a* and 12*b* are connected to each other by the bonding layer 16. In addition, in the dotted-line block as shown in FIG. 4C, the channel 14*a* filled with the conductive member 15*a* is composed of the first through hole h1*b* of the first substrate 11*b* and the corresponding second through hole h2*a* of the second substrate 12*a*. In this embodiment, the conductive pad 131*b* and the conductive pad 132*a* are respectively arranged at the first substrate 11*b* and the second substrate 12*a*. In this embodiment, the inner surface S2 of the first substrate 11*b* is provided with a trace layer 21*b*, the inner surface S3 of the second substrate 12*a* is provided with a trace layer 22*a*, and the conductive member 15*a* disposed in the channel 14*a* can be electrically connected to the trace layer 21*b* disposed at the first substrate 11*b* and the trace layer 22*a* disposed at the second substrate 12*a* at the same time.

As mentioned above, in the electronic device 1 of this embodiment, the conductive pads 131 and 132 of each pad group 13 are respectively arranged at the outer surface S1 of the first substrate 11 and the outer surface S4 of the second substrate 12 and corresponding to each other. A plurality of channels 14 communicate the first substrate 11 and the second substrate 12, each channel 14 corresponds to one of pad group 13, and two ends E1 and E2 of each channel 14 are respectively sealed by the conductive pads 131 and 132 of the corresponding pad group 13. A plurality of conductive members 15 are arranged in the channels 14, and each conductive member 15 is electrically connected to the conductive pads 131 and 132 of the corresponding pad group 13. Accordingly, the electrical signals can transmitted between the conductive pads 131 and 132, which are arranged at the outermost layers of the electronic device 1, by conductive members 15 filled in the channels 14. As a result, the electronic device 1 of this embodiment uses blind holes (channels 14) with conductive members 15 to electrically connect the traces arranged at the outermost layers (the outer surfaces S1 and S4) thorough pad group(s) 13, thereby achieving the signal transmission between the outer surface S1 of the first substrate 11 and the outer surface S4 of the second substrate 12.

Figure 2:
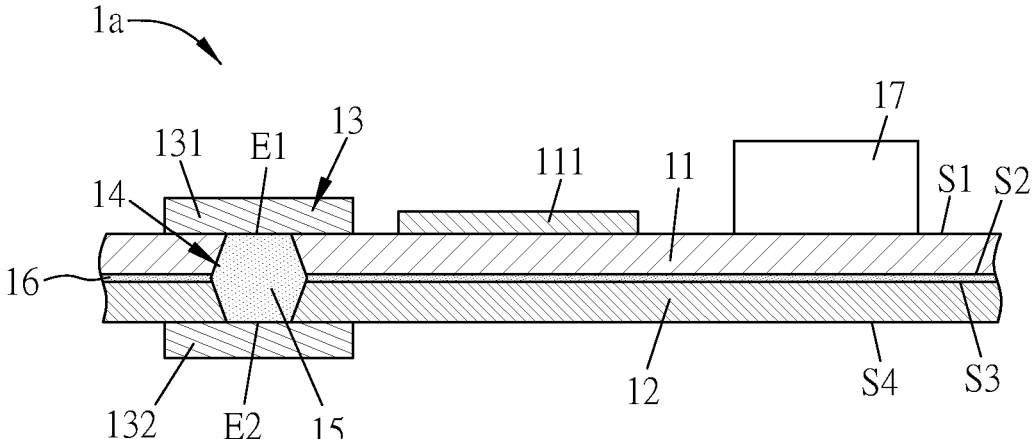
FIGS. 2, 3A, 3B, 4A to 4C and 5 are schematic diagrams showing a part of an electronic device according to different embodiments of this disclosure.

As shown in FIG. 2, the electronic device 1*a* of this embodiment is mostly the same as the electronic device 1 of the previous embodiment. Unlike the electronic device 1, the electronic device 1*a* of this embodiment further includes a trace layer 111, which is arranged at the outer surface S1 of the first substrate 11 and is electrically connected to at least one of the conductive pads 131 of the pad groups 13 arranged at the outer surface S1 of the first substrate 11. The trace layer 111 may include a conductive layer or/and conductive wires for transmitting electrical signals, and the material thereof may include metals such as gold, copper or aluminum, or any combination thereof, or the alloy of any combination thereof, or any of other conductive materials. In some embodiments, the trace layer 111 can be formed by a thin film process, so the thickness thereof can be relatively thinner; in such case, the thickness of the trace layer 111 can be not greater than ¼ mil. In different embodiments, the additional trace layer(s) can be selectively provided at the inner surface S2 of the first substrate 11, the inner surface S3 of the second substrate 12, or the outer surface S4 of the second substrate 12, and this disclosure is not limited thereto. To be noted, the term "thickness" is defined in the direction perpendicular to the outer surface (S1 or S4) of the substrate (e.g. the first substrate 11 or the second substrate 12).

Figure 5:
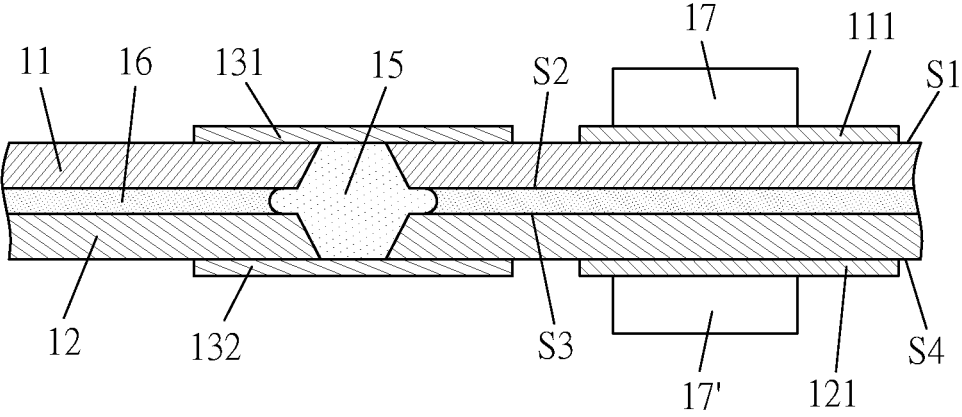

In addition, the electronic device 1*a* can further include a plurality of electronic components 17 (here is only one electronic component 17 shown in FIG. 2). The electronic components 17 are arranged at the outer surface S1 of the first substrate 11, and each electronic component 17 is electrically connected to at least one of the conductive pads 131 arranged at the outer surface S1 of the first substrate 11. In some embodiments, the electronic component 17 can be electrically connected to the conductive pad 131 by the trace layer 111, and then electrically connected to the corresponding conductive pad 132 by the conductive member 15. In some embodiments, the electronic component 17 can be a driver, an active component, a passive component, an active circuit or a passive circuit. In some embodiments, one or ones of the electronic components 17 can be self-luminous components such as, for example but not limited to, light-emitting diodes (LEDs), Mini LEDs or Micro LEDs. In some embodiments, one or ones of the electronic components 17 can be flip-chip components (i.e., surface mount devices (SMD)). In some embodiments, one or ones of the electronic components 17 can be thin-film components manufactured by thin-film processes, such as thin-film transistors (TFT). The thin-film processes can include low-temperature polysilicon semiconductor (LTPS) process, high-temperature polysilicon semiconductor (HTPS) process, low-temperature polycrystalline oxide (LTPO) semiconductor process, or indium-gallium-zinc oxide (IGZO) semiconductor process, or the likes. In some embodiments, one or ones of the electronic components 17 can be radio frequency ICs, driver ICs (e.g. silicon ICs or non-silicon ICs). The radio frequency IC can be, for example, a silicon RFIC, or a non-silicon RFIC (e.g. a GaAs MMIC). The type or kind of the electronic components 17 is not limited in this disclosure. Therefore, the electrical signal outputted by the electronic component 17 of this embodiment can be transmitted to the outer surface S4 of the second substrate 12 by the trace layer 111, the conductive pad 131, the conductive member 15 and the conductive pad 132. In another case, the electrical signal of the outer surface S4 of the second substrate 12 can be transmitted to the electronic component 17 arranged at the outer surface S1 of the first substrate 11 by the conductive pad 132, the conductive member 15, the conductive pad 131 and the trace layer 111. In some embodiments, two or more electronic components 17 can be respectively arranged at the outer surface S1 of the first substrate 11 and the outer surface S4 of the second substrate 12. When the electronic components 17 are self-luminous components, the electronic device can be a double-sided display device. In addition, the electronic device as shown in FIG. 5 includes electronic components 17 arranged at the outer surface S1 of the first substrate 11 and electronic components 17' arranged at the outer surface S4 of the second substrate 12, and the electronic components 17 are symmetrical to the electronic components 17' in the direction of the bonding surfaces of the two substrates 11 and 12. When the electronic components 17 and 17' are self-luminous components, the electronic device can share the trace layer for the pixels that are symmetrically arranged (upper-lower symmetric or left-right symmetric) so as to available space for circuit design, thereby increasing the arrangement density of the electronic components.

In summary, the present disclosure describes an electronic device where two conductive pads from each pad group are situated on the outer surfaces of the first and second substrates respectively and correspond to each other. The channels establish communication with both of the first and second substrates, with each channel corresponds to one of the pad groups, and two ends of each channel are respectively sealed by two conductive pads of the corresponding pad group. The conductive members are individually placed within the channels, and each conductive member electrically connects to the conductive pads of the corresponding pad group. Given this design and configuration, some electrical signals can be transmitted between the conductive pads that are formed at the outermost layers of both substrates by the conductive members situated in the channels. As a result, an electrical connection between the trace layers at the outermost layers of both substrates in the electronic device is accomplished by blind holes (the channels per se) with conductive members, enabling signal transmission between the outermost layers of both substrates in the electronic device. According to the present invention, it may further include one or more additional substrate applied between the first and second substrates, and the electrical connection between the trace layers at the outermost layers of both substrates mentioned above are also accomplished as well. It would be noted that the electrical connection between the trace layers at the outermost layers of both substrates is maintained whether or not possible additional substrates are included.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
a first substrate and a second substrate stacked on each other, wherein each of the first substrate and the second substrate has an inner surface and an outer surface, the inner surfaces of the first substrate and the second substrate face to each other, and the outer surfaces of the first substrate and the second substrate are away from each other;
a plurality of pad groups, wherein each of the pad groups comprises two conductive pads, and the two conductive pads of one of the pad groups are respectively disposed at the outer surfaces of the first substrate and the second substrate and are corresponded to each other;

a plurality of channels communicating with the first substrate and the second substrate, wherein each of the channels corresponds to one of the pad groups, and two ends of each of the channels are respectively sealed by the two conductive pads of the corresponding pad group;
a plurality of conductive members disposed in the channels respectively, wherein each of the conductive members electrically connects to the two conductive pads of the corresponding pad group; and
a bonding layer arranged between the first substrate and the second substrate, wherein each of the conductive members passes through the bonding layer.

2. The electronic device of claim 1, wherein the quantity of the first substrate is multiple, and the first substrates are laid and tiled along the inner surface of the second substrate.

3. The electronic device of claim 1, wherein each of the channels is wider at a middle part than two ends thereof.

4. The electronic device of claim 1, wherein the first substrate defines a plurality of first through holes, the second substrate defines a plurality of second through holes, the first through holes correspond to the second through holes respectively, and each of the first through holes and a corresponding one of the second through holes are together to form at least part of one of the corresponding channels.

5. The electronic device of claim 4, wherein one end, approaching the inner surface of the first substrate, is wider than the other end, approaching the outer surface of the first substrate, at each of the first through holes; and one end, approaching the inner surface of the second substrate, is wider than the other end, approaching the outer surface of the second substrate, at each of the second through holes.

6. The electronic device of claim 1, wherein each of the conductive members is made of one single material.

7. The electronic device of claim 1, wherein the outer surface of the first substrate includes a trace layer provided with a thickness, the trace layer is electrically connected to at least one of the conductive pads of the pad groups arranged at the outer surface of the first substrate, and the thickness of the trace layer is no greater than ¼ mil.

8. The electronic device of claim 1, further comprising:
a plurality of electronic components arranged at the outer surface of the first substrate, and at least part of the electronic components are electrically connected to ones of the conductive pads of the pad groups arranged at the outer surface of the first substrate respectively.

9. The electronic device of claim 8, wherein at least part of the electronic components are arranged at the outer surface of the second substrate, and the electronic components are electrically connected to ones of the conductive pads of the pad groups arranged at the outer surface of the second substrate respectively.

* * * * *